United States Patent
Jou et al.

(10) Patent No.: US 12,310,123 B2
(45) Date of Patent: May 20, 2025

(54) LIGHT DETECTING DEVICE, OPTICAL DEVICE AND METHOD OF MANUFACTURING THE SAME

(71) Applicant: TAIWAN SEMICONDUCTOR MANUFACTURING COMPANY LTD., Hsinchu (TW)

(72) Inventors: Chewn-Pu Jou, Hsinchu (TW); Lan-Chou Cho, Hsinchu (TW); Weiwei Song, San Jose, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 162 days.

(21) Appl. No.: 17/749,226

(22) Filed: May 20, 2022

(65) Prior Publication Data
US 2022/0278247 A1  Sep. 1, 2022

Related U.S. Application Data

(62) Division of application No. 16/837,895, filed on Apr. 1, 2020, now Pat. No. 11,367,803.

(51) Int. Cl.
*H10F 30/21* (2025.01)
*G01S 7/481* (2006.01)
(Continued)

(52) U.S. Cl.
CPC ............ *H10F 30/21* (2025.01); *G01S 7/4816* (2013.01); *H10F 39/107* (2025.01); *H10F 39/18* (2025.01);
(Continued)

(58) Field of Classification Search
CPC . G01S 7/4816; G02B 6/12004; G02B 6/4274; G02B 2006/12061; G02B 2006/12123; G02B 2006/12195; H01L 27/14; H01L 27/142; H01L 27/1446; H01L 27/14643; H01L 31/02019;
(Continued)

(56) References Cited

U.S. PATENT DOCUMENTS

| 7,397,101 B1 * | 7/2008 | Masini ................ G02B 6/4295 |
| | | 257/656 |
| 2014/0138787 A1 | 5/2014 | Hellings et al. |
| 2019/0288132 A1 | 9/2019 | Wang et al. |

FOREIGN PATENT DOCUMENTS

| JP | 2011066400 A | 3/2011 |
| JP | 2014107562 A | 6/2014 |

(Continued)

*Primary Examiner* — Bo B Jang
(74) *Attorney, Agent, or Firm* — WPAT LAW; Anthony King

(57) ABSTRACT

The present disclosure provides a light detecting device. The light detecting devices includes an insulating layer, a silicon layer, a light detecting layer, N first doped regions and M second doped regions. The silicon layer is disposed over the insulating layer. The light detecting layer is disposed over the silicon layer and extends within at least a portion of the silicon layer. The first doped regions have a first dopant type and are disposed within the light detecting layer. The second doped regions have a second dopant type and are disposed within the light detecting layer. The first doped regions and the second doped regions are alternatingly arranged. M and N are integers equal to or greater than 2.

20 Claims, 16 Drawing Sheets

(51) Int. Cl.
*H10F 39/10* (2025.01)
*H10F 39/18* (2025.01)
*H10F 71/00* (2025.01)
*H10F 77/00* (2025.01)
*H10F 77/1223* (2025.01)
*H10F 77/124* (2025.01)
*H10F 77/14* (2025.01)
*H10F 77/40* (2025.01)

(52) U.S. Cl.
CPC ......... *H10F 71/121* (2025.01); *H10F 71/127* (2025.01); *H10F 77/1223* (2025.01); *H10F 77/1243* (2025.01); *H10F 77/147* (2025.01); *H10F 77/413* (2025.01); *H10F 77/953* (2025.01)

(58) Field of Classification Search
CPC ............. H01L 31/02327; H01L 31/028; H01L 31/0288; H01L 31/03042; H01L 31/035281; H01L 31/09; H01L 31/101; H01L 31/102; H01L 31/1032; H01L 31/105; H01L 31/18; Y02P 70/50
USPC ....................................................... 257/428
See application file for complete search history.

(56) References Cited

FOREIGN PATENT DOCUMENTS

| | | |
|---|---|---|
| KR | 1020150026992 A | 3/2015 |
| TW | 201709490 A | 3/2017 |

\* cited by examiner

LIGHT DETECTING DEVICE, OPTICAL DEVICE AND METHOD OF MANUFACTURING THE SAME

PRIORITY CLAIM AND CROSS-REFERENCE

This application is a divisional application of non-provisional application Ser. No. 16/837,895 filed on Apr. 1, 2020, entitled "LIGHT DETECTING DEVICE, OPTICAL DEVICE AND METHOD OF MANUFACTURING THE SAME," the disclosure of which is hereby incorporated by reference in its entirety.

BACKGROUND

Optical signals can be used in various applications including high speed and secure data transmission between two or more devices. Photodiodes are used in converting received photons into electrical currents. The performance of a photodiode is usually assessed in terms of several parameters, such as the quantum efficiency, operational wavelength, sensitivity and the like. It is desirable to improve the performance of a photodiode.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
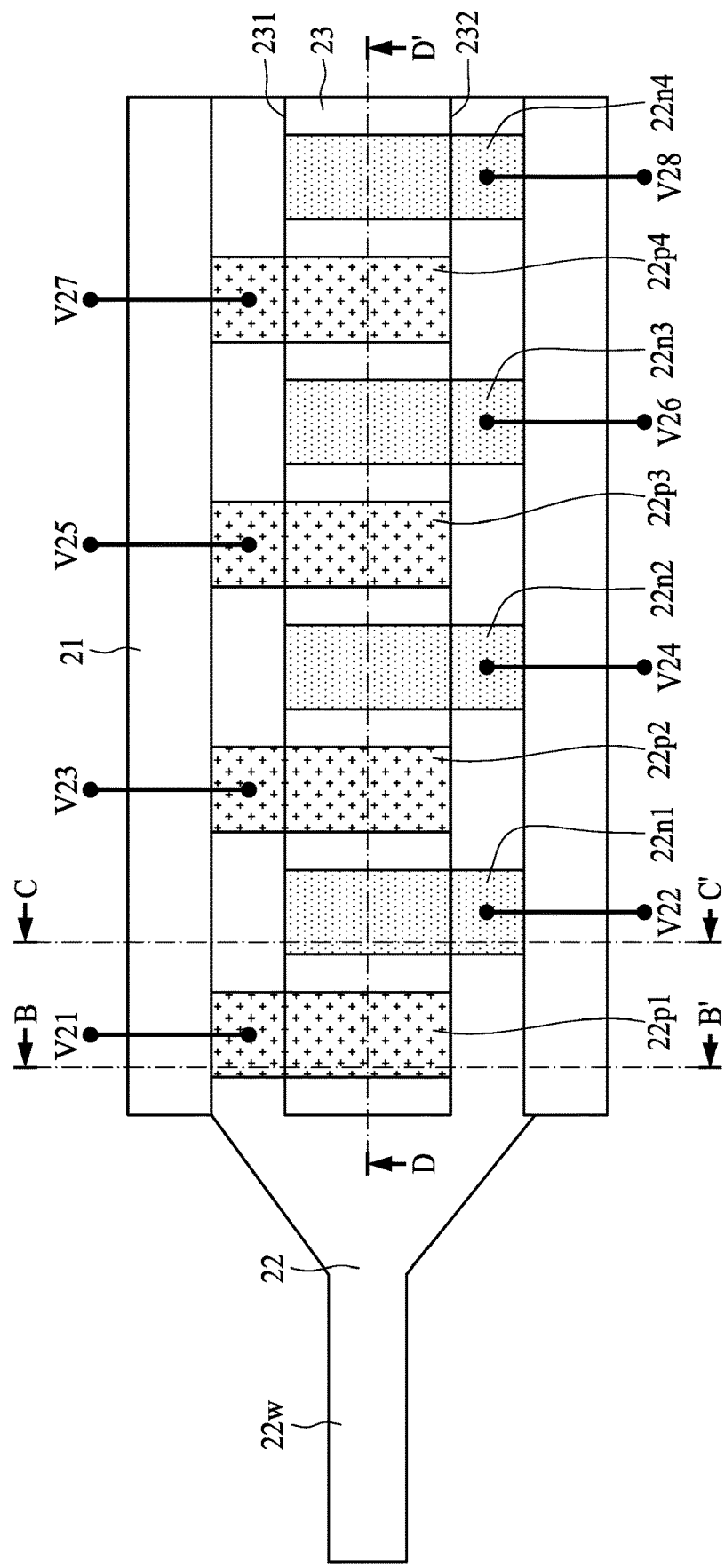
FIG. 1A illustrates a top view of a light detecting device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1B:
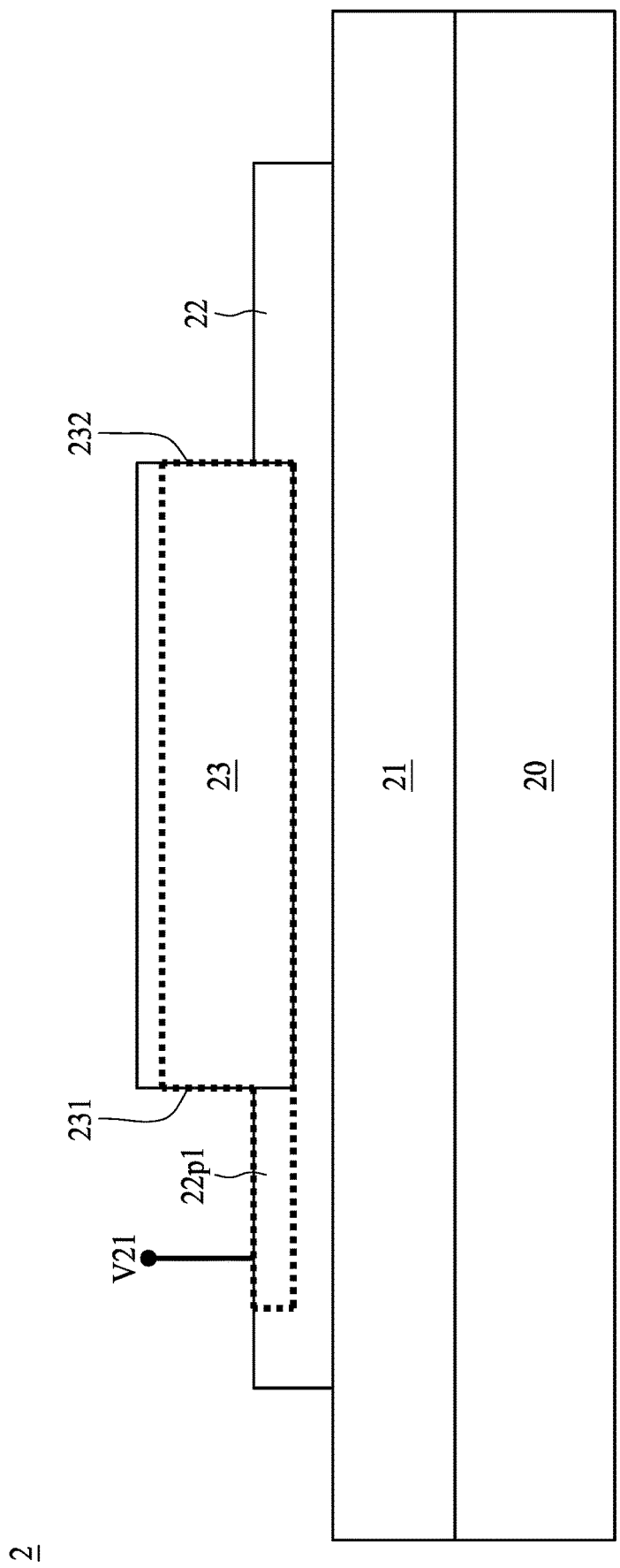
FIG. 1B illustrates a cross-sectional view of the light detecting device as shown in FIG. 1A, in accordance with some embodiments of the present disclosure.
Figure 1C:
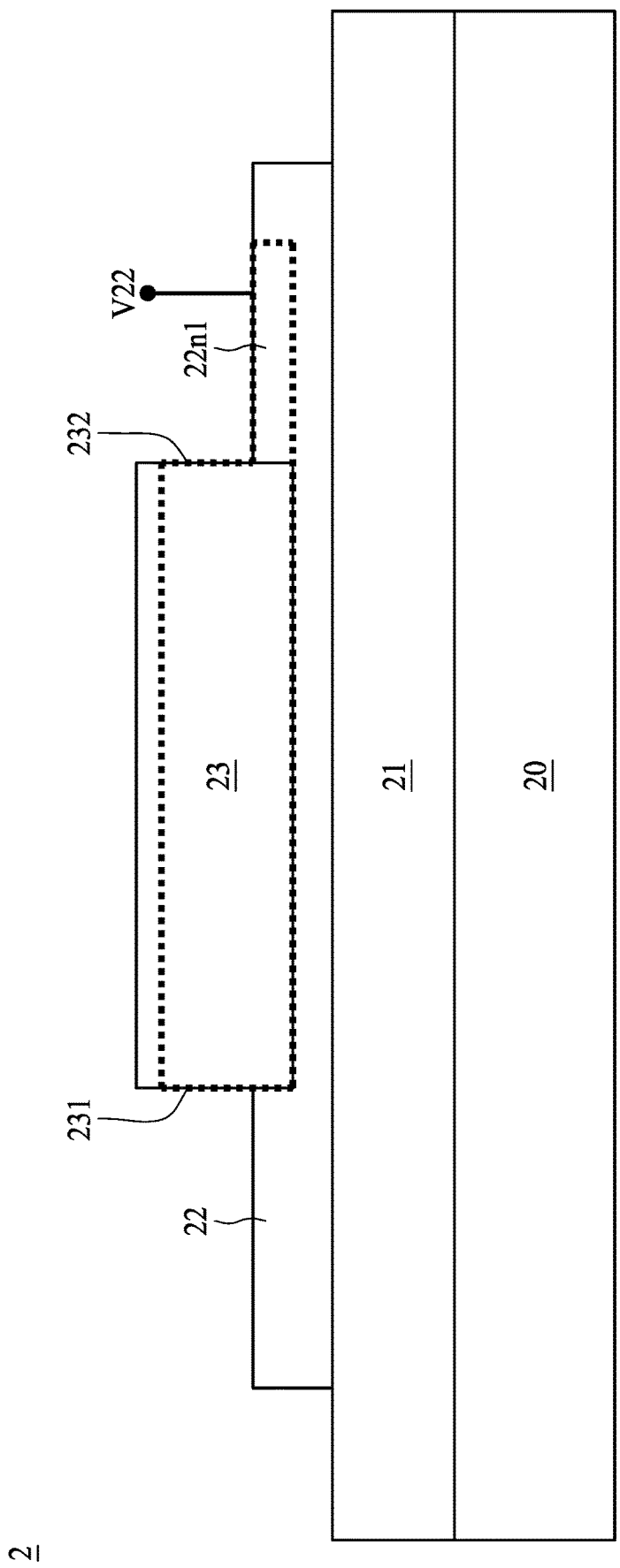
FIG. 1C illustrates a cross-sectional view of the light detecting device as shown in FIG. 1A, in accordance with some embodiments of the present disclosure.
Figure 1D:
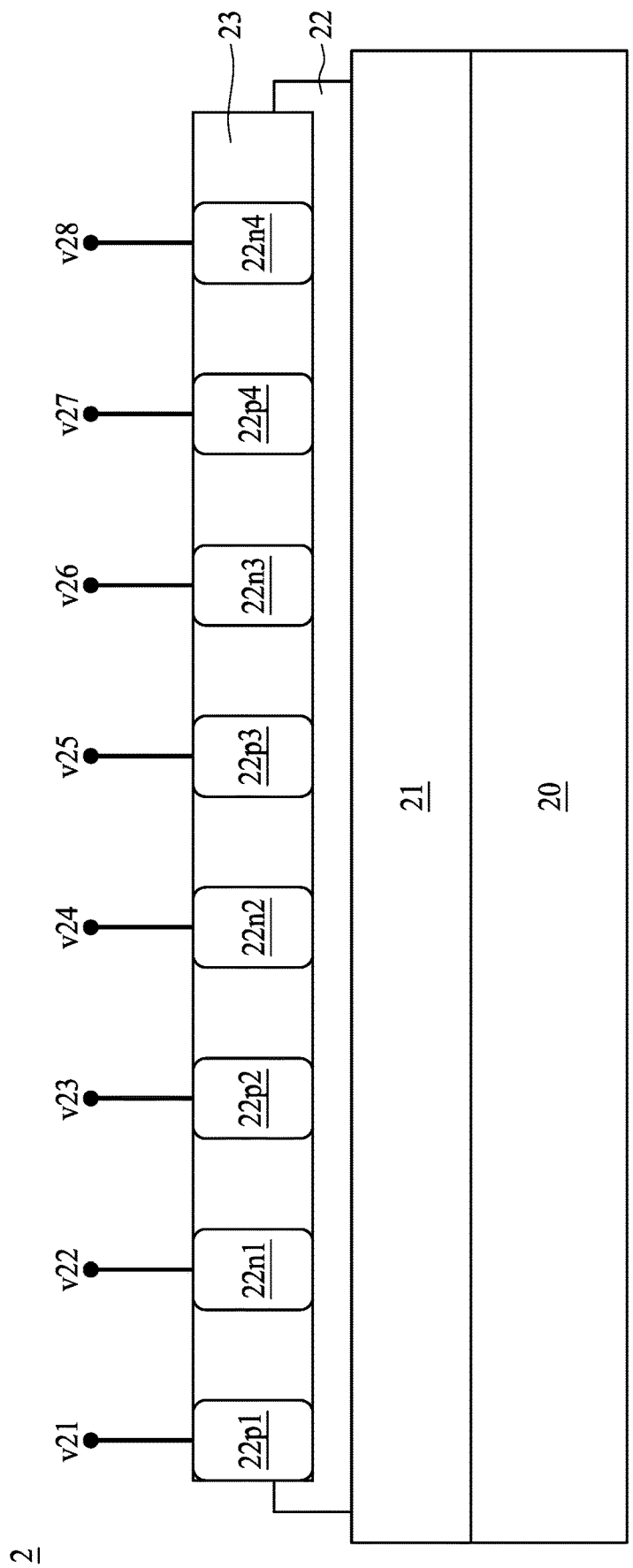
FIG. 1D illustrates a cross-sectional view of the light detecting device as shown in FIG. 1A, in accordance with some embodiments of the present disclosure.

FIG. 1A illustrates a top view of a light detecting device 2 in accordance with some embodiments of the present disclosure. FIG. 1B illustrates a cross-sectional view of the light detecting device 2 taken along the line B-B' as shown in FIG. 1A, in accordance with some embodiments of the present disclosure. FIG. 1C illustrates a cross-sectional view of the light detecting device 2 taken along the line C-C' as shown in FIG. 1A, in accordance with some embodiments of the present disclosure. FIG. 1D illustrates a cross-sectional view of the light detecting device 2 taken along the line D-D' as shown in FIG. 1A, in accordance with some embodiments of the present disclosure. In some embodiments, the light detecting device 2 is a photodiode or a photodetector. The light detecting device 2 may include a substrate 20, an insulating layer 21, a silicon layer 22 and a light detecting layer 23.

The substrate 20 includes a semiconductor material such as silicon. In some embodiments, the substrate 20 may include other semiconductor materials, such as silicon germanium, silicon carbide, gallium arsenide, or the like. Alternatively, the substrate 20 includes another elementary semiconductor, such as germanium, a compound semiconductor including gallium arsenic, gallium phosphide, indium phosphide, indium arsenide, or indium antimonide; an alloy semiconductor including SiGe, GaAsP. AlInAs, AlGaAs, GaInAs, GaInP, or GaInAsP; or combinations thereof. In yet another embodiment, the substrate 20 is a SOI. In other alternatives, the substrate 20 may include a doped epitaxial layer, a gradient semiconductor layer, and/or a semiconductor layer overlaying another semiconductor layer of a different type, such as a silicon layer on a silicon germanium layer.

The insulating layer 21 is disposed on the substrate 20. The insulating layer 21 may be STI or LOCOS. In some embodiments, the insulating layer 21 may include an oxide (e.g., silicon oxide or Ge oxide), a nitride (e.g., silicon nitride), an oxynitride (e.g., GaP oxynitride), $SiO_2$, a nitrogen-bearing oxide (e.g., nitrogen-hearing $SiO_2$), a nitrogen-doped oxide (e.g., $N_2$-implanted $SiO_2$). $Si_xO_yN_z$, a polymer material, or the like. In some embodiments, the insulating layer 21 may be also referred to as a buried oxide or a BOX layer.

The silicon layer 22 is disposed on the insulating layer 21. As shown in FIGS. 1A and 1D, the silicon layer 22 may include a plurality of n-doped regions 22n1, 22n2, 22n3, 22n4 and p-doped regions 22p1, 22p2, 22p3, 22p4. The n-doped regions 22n1, 22n2, 22n3, 22n4 and the p-doped regions 22p1, 22p2, 22p3, 22p4 are alternatingly arranged. In other words, there is one n-doped region between two adjacent p-doped regions or there is one p-doped region between two adjacent n-doped regions. For example, the n-doped region 22n1 may be disposed between two adjacent p-doped regions 22p1 and 22p2. For example, the p-doped region 22p2 may be disposed between two adjacent n-doped regions 22n1 and 22n2. In some embodiments, there may be any number of n-doped regions and p-doped regions depending on different design specifications. For example, there may be N n-doped regions and N p-doped regions, where N is an integer greater than 1. The doping concentration amounts for the n-doped regions 22n1, 22n1, 22n3, 22n4 and the p-doped regions 22p1, 22p2, 22p3, 22p4 may vary with the process used and the particular design. In some embodiments, doping concentrations at a p-type material or an n-type material may range from about $10^{17}$ atoms/cm$^3$ to $10^{19}$ atoms/cm$^3$.

The light detecting layer 23 is disposed over the silicon layer 22 and diffuses within at least a portion of the silicon layer 22. In some embodiments, the light detecting layer 23 may be formed of or include silicon, germanium, indium gallium arsenide, lead sulfide, mercury cadmium telluride or any other suitable materials.

In some embodiments, as shown in FIG. 1B, the p-doped region 22p1 may diffuse or extend within the light detecting layer 23. For example, the p-doped region 22p1 may include a first portion disposed within a portion of the silicon layer 22 adjacent to a lateral surface 231 of the light detecting layer 23 and a second portion disposed within the light detecting layer 23. In some embodiments, a thickness of the p-doped region 22p1 within the light detecting layer 23 (e.g., the second portion of the p-doped region 22p1) is equal to or less than a thickness of the light detecting layer 23. In some embodiments, the thickness of the p-doped region 22p1 within the light detecting layer 23 is greater than a thickness of the p-doped region 22p1 within the silicon layer 22 (e.g., the first portion of the p-doped region 22p1). In some embodiments, the p-doped region 22p1 may diffuse from the lateral surface 231 of the light detecting layer 23 to an opposite lateral surface 232. For example, a width of the p-doped region 22p1 within the light detecting layer 23 may be substantially the same as a width of the light detecting layer 23.

Figure 2A:
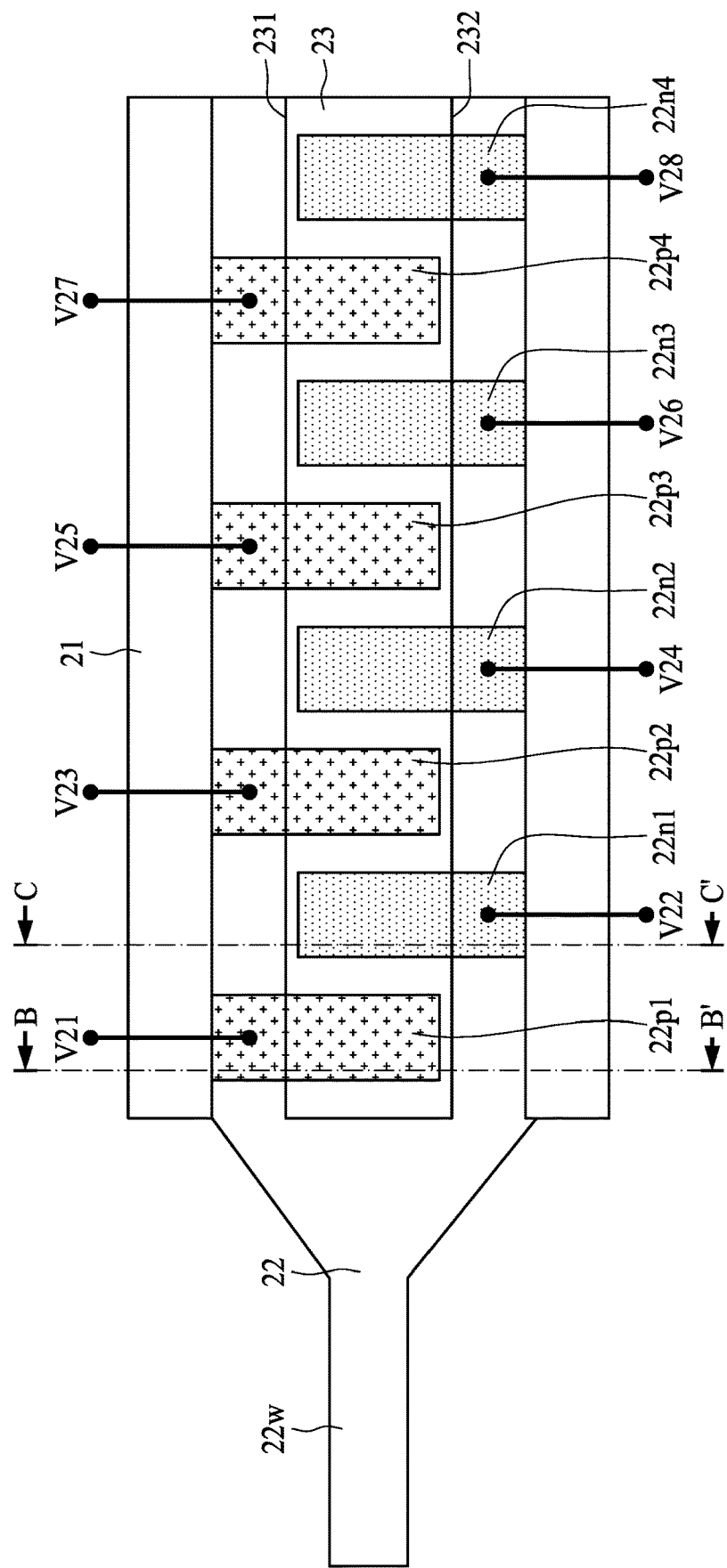
FIG. 2A illustrates a top view of a light detecting device, in accordance with some embodiments of the present disclosure.
Figure 2B:
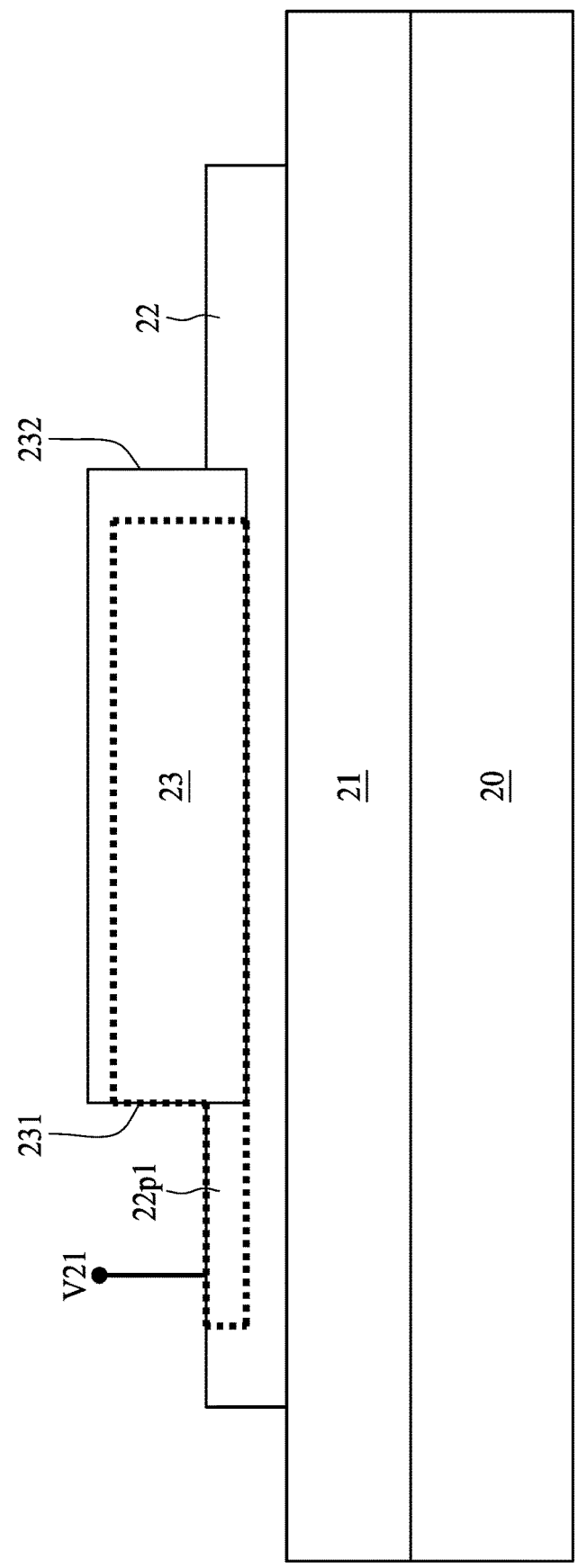
FIG. 2B illustrates a cross-sectional view of the light detecting device as shown in FIG. 2A, in accordance with some embodiments of the present disclosure.

In other embodiments, as shown in FIGS. 2A and 2B, which respectively illustrate a top view and a cross-sectional view of a light detecting device 3 in accordance with some embodiments of the present disclosure, the p-doped region 22p1 does not diffuse to the lateral surface 232 of the light detecting layer 23. For example, the width of the p-doped region 22p1 within the light detecting layer 23 may be less than the width of the light detecting layer 23. For example, there may be a distance between the lateral surface 232 of the light detecting layer 23 and the p-doped region 22p1.

Figure 3A:
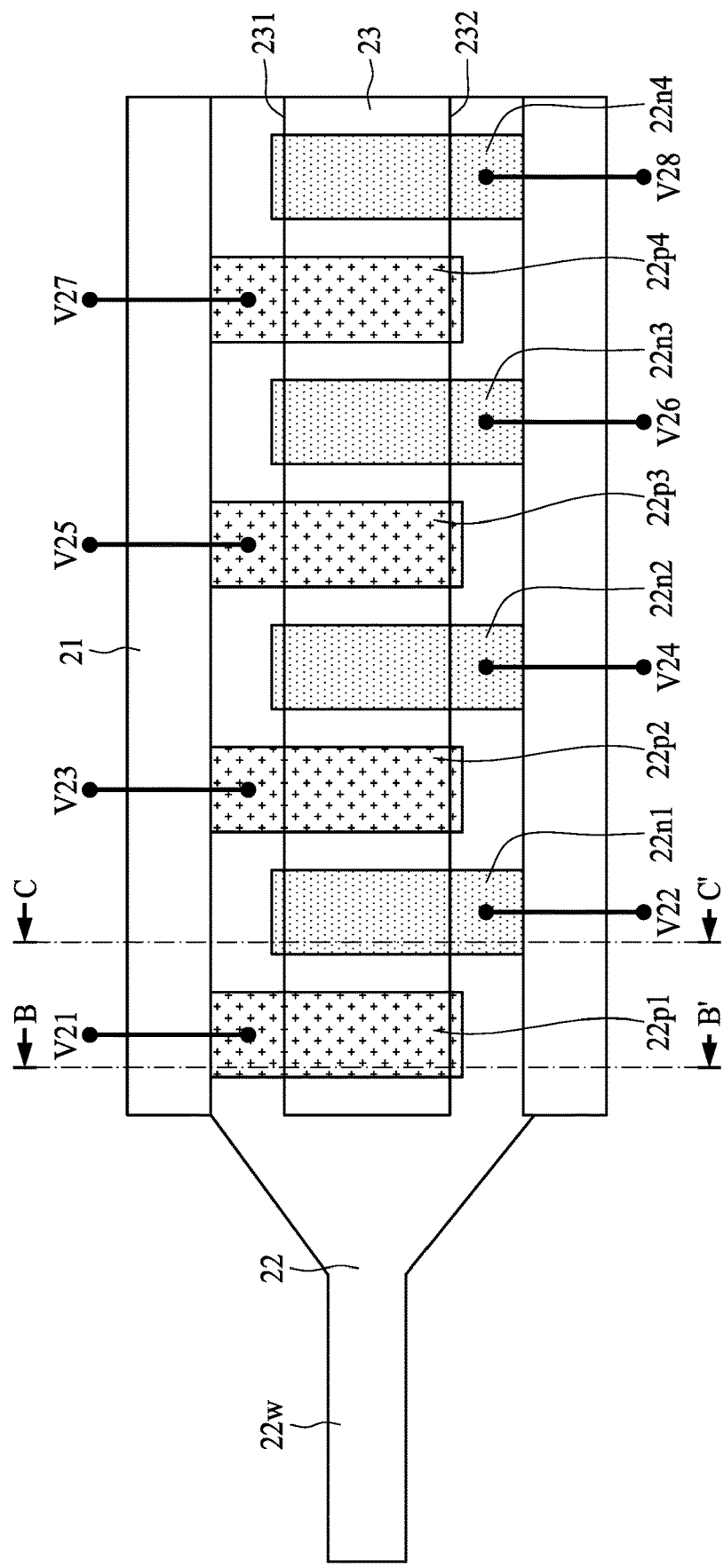
FIG. 3A illustrates a top view of a light detecting device, in accordance with some embodiments of the present disclosure.
Figure 3B:
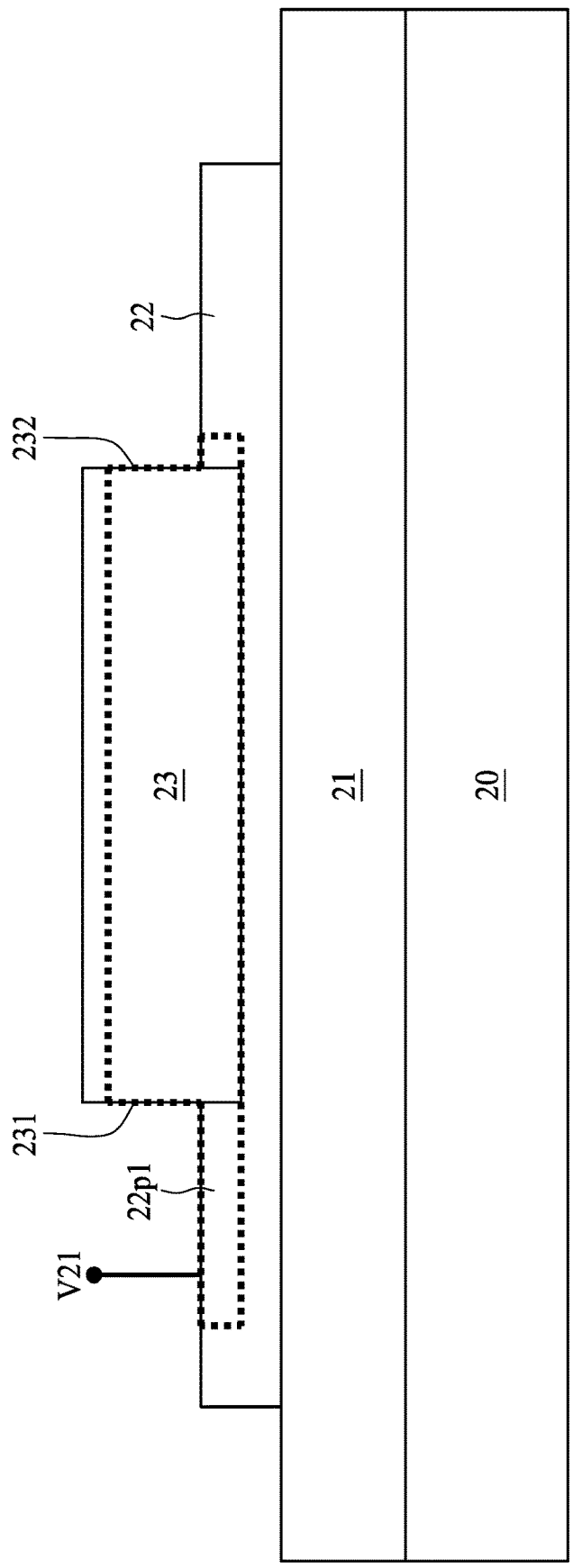
FIG. 3B illustrates a cross-sectional view of the light detecting device as shown in FIG. 3A, in accordance with some embodiments of the present disclosure.

In other embodiments, as shown in FIGS. 3A and 3B, which respectively illustrate a top view and a cross-sectional view of a light detecting device 4 in accordance with some embodiments of the present disclosure, the p-doped region 22p1 further diffuses out from the lateral surface 232 of the light detecting layer 23 and diffuses within a part of the silicon layer 22 adjacent to the lateral surface 232 of the light detecting layer 23. For example, the p-doped region 22p1 may include a first portion disposed within a portion of the silicon layer 22 adjacent to the lateral surface 231 of the light detecting layer 23, a second portion disposed within the light detecting layer 23 and a third portion disposed within a portion of the silicon layer 22 adjacent to the lateral surface 232 of the light detecting layer 23.

Referring to FIG. 1C, the n-doped region 22n1 may diffuse or extend within the light detecting layer 23. In some embodiments, a thickness of the n-doped region 22n1 within the light detecting layer 23 is equal to or less than the thickness of the light detecting layer 23. In some embodiments, the thickness of the n-doped region 22n1 within the light detecting layer 23 is greater than a thickness of the n-doped region 22n1 within the silicon layer 22. In some embodiments, the n-doped region 22n1 may diffuse from the lateral surface 232 of the light detecting layer 23 to the lateral surface 231. For example, a width of the n-doped region 22n1 within the light detecting layer 23 may be substantially the same as a width of the light detecting layer 23.

Figure 2C:
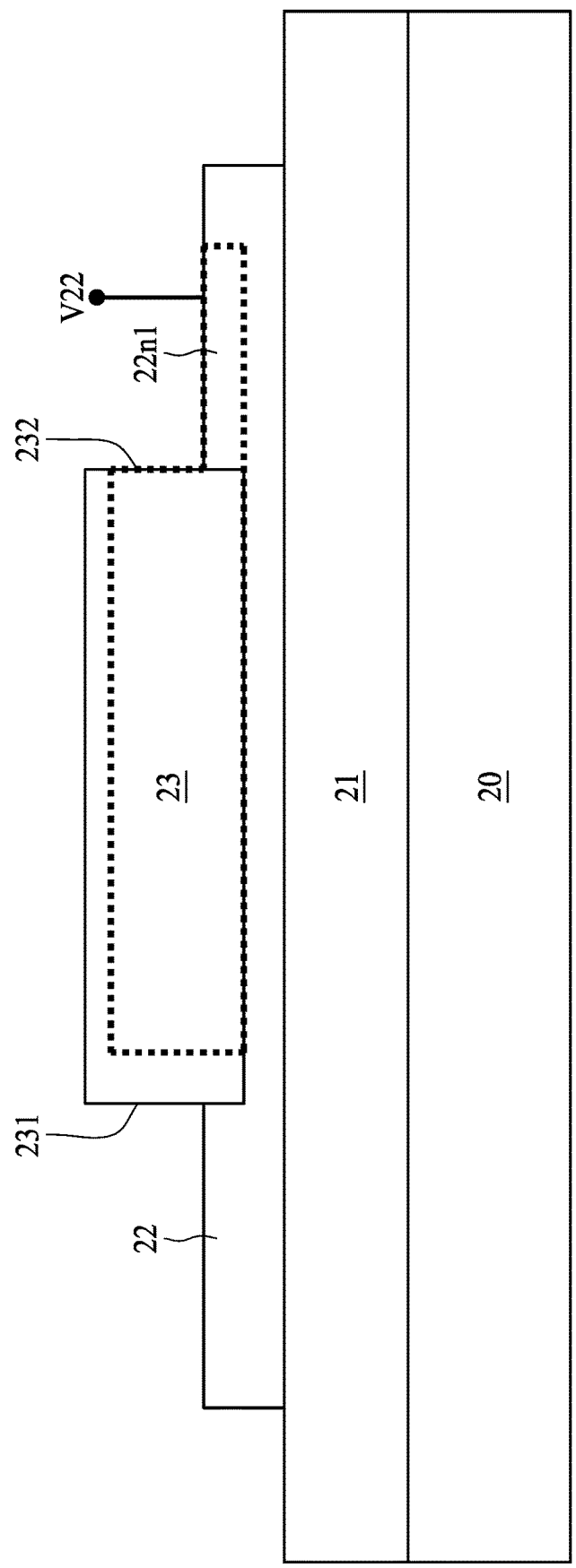
FIG. 2C illustrates a cross-sectional view of the light detecting device as shown in FIG. 2A, in accordance with some embodiments of the present disclosure.

In other embodiments, as shown in FIGS. 2A and 2C, which respectively illustrate a top view and a cross-sectional view of the light detecting device 3 in accordance with some embodiments of the present disclosure, the n-doped region 22n1 does not diffuse to the lateral surface 231 of the light detecting layer 23. For example, the width of the n-doped region 22n1 within the light detecting layer 23 may be less than the width of the light detecting layer 23. For example, there may be a distance between the lateral surface 231 of the light detecting layer 23 and the n-doped region 22n1.

Figure 3C:
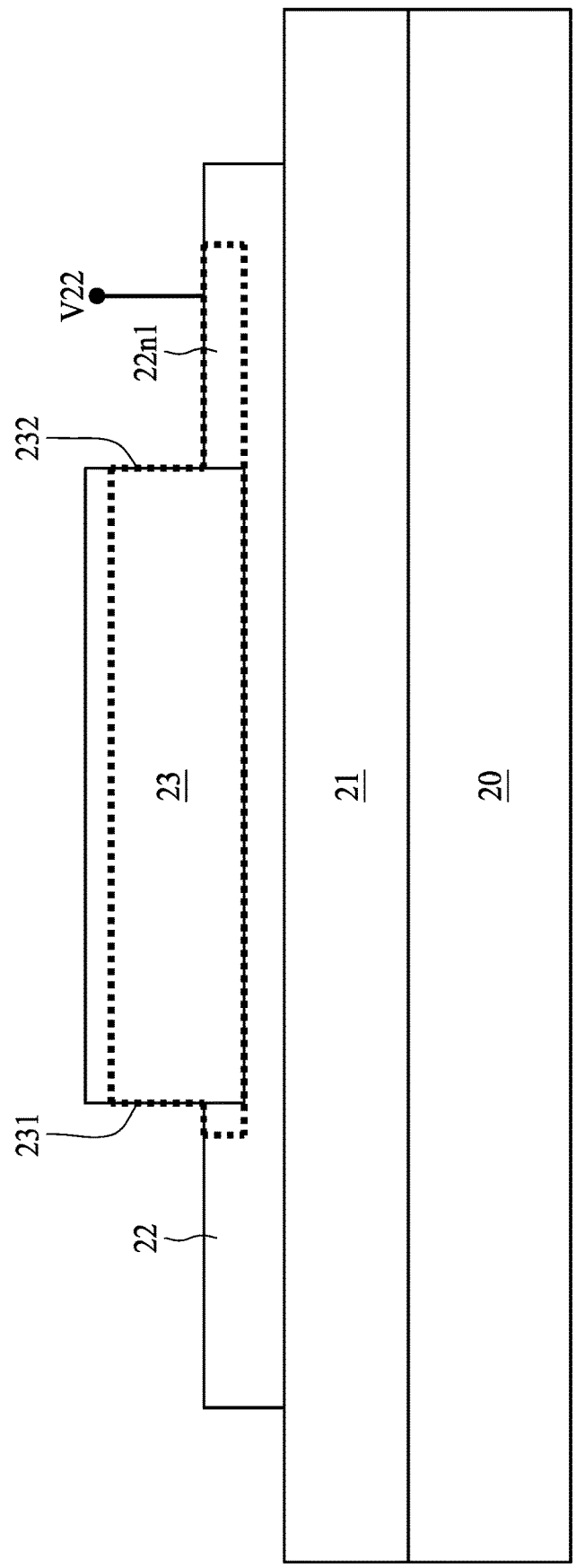
FIG. 3C illustrates a cross-sectional view of the light detecting device as shown in FIG. 3A, in accordance with some embodiments of the present disclosure.

In other embodiments, as shown in FIGS. 3A and 3C, which respectively illustrate a top view and a cross-sectional view of a light detecting device 4 in accordance with some embodiments of the present disclosure, the p-doped region 22n1 further diffuses out from the lateral surface 231 of the light detecting layer 23 and diffuses within a part of the silicon layer 22 adjacent to the lateral surface 231 of the light detecting layer 23.

Referring to FIG. 1D, the light detecting layer 23 is disposed on the silicon layer 22. A portion of the light detecting layer 23 is within the silicon layer 22. For example, the silicon layer 22 may include an opening or a trench, and the light detecting layer 23 may be disposed within the opening or the trench. The light detecting layer 23 may protrude from a top surface of the silicon layer 22. In some embodiments, a portion of the silicon layer 22 is disposed between the light detecting layer 23 and the insulating layer 21.

As shown in FIG. 1A, the silicon layer 22 may include or define a waveguide structure 22w. The waveguide structure 22w may extend in a first direction (e.g., axial direction) substantially parallel to the length of the light detecting layer. The waveguide structure 22w may serve as a conduit for guiding light (or photons) into the light detecting layer 23 in the first direction. The p-doped regions 22p1, 22p2, 22p3, 22p4 and the n-doped regions 22n1, 22n2, 22n3, 22n4 are alternatingly arranged in a direction substantially perpendicular to the first direction.

In operation, the p-doped regions 22p1, 22p2, 22p3, 22p4 are respectively electrically coupled to cathode nodes V21, V23, V25, V27 and the n-doped regions 22n1, 22n2, 22n3, 22n4 are respectively electrically coupled to anode nodes V22, V24, V26, V28. When the light detecting device 2 is biased with an appropriate voltage via the cathode nodes V21, V23, V25, V27 and the anode nodes V22, V24, V26, V28, incident photons will trigger the generation of free electron-hole pairs in the light detecting layer 23. Holes move toward the anode nodes V22, V24, V26, V28, and electrons move toward the cathode nodes V21, V23, V25, V27, and a photocurrent (or sensing current) is produced.

As shown in FIG. 1A, the light detecting layer 23 may be divided into a plurality of regions. For example, the light detecting layer 23 may include the region defined by the p-doped region 22p1 and the n-doped region 22n1, the region defined by the n-doped region 22n1 and the p-doped region 22p2, the region defined by the p-doped region 22p2 and the n-doped region 22n2, the region defined by the n-doped region 22n2 and the p-doped region 22p3, the region defined by the p-doped region 22p3 and the n-doped region 22n3, the region defined by the n-doped region 22n3 and the p-doped region 22p4, the region defined by the p-doped region 22p4 and the n-doped region 22n4.

When the light passes the p-doped region 22p1 and enters the region defined by the light detecting layer 23, the p-doped region 22p1 and the n-doped region 22n1, incident photons will trigger the generation of free electron-hole pairs in the region defined by the light detecting layer 23, the p-doped region 22p1 and the n-doped region 22n1. Holes move toward the anode node V22, and electrons move toward the cathode node V21, and a photocurrent (or sensing current) is produced. Similarly, when the light passes the p-doped region 22p1, the n-doped region 22n1 and the p-doped region 22p2 and enters the region defined by the light detecting layer 23, the p-doped region 22p2 and the n-doped region 22n2, incident photons will trigger the generation of free electron-hole pairs in the region defined by the light detecting layer 23, the p-doped region 22p2 and the n-doped region 22n2. Holes move toward the anode node V24, and electrons move toward the cathode node V23, and a photocurrent (or sensing current) is produced. Similarly, when the light passes the p-doped region 22p1, the n-doped region 22n1, the p-doped region 22p2, the n-doped region 22n2 and the p-doped region 22p3 and enters the region defined by the light detecting layer 23, the p-doped region 22p3 and the n-doped region 22n3, incident photons will trigger the generation of free electron-hole pairs in the region defined by the light detecting layer 23, the p-doped region 22p3 and the n-doped region 22n3. Holes move toward the anode node V26, and electrons move toward the cathode node V25, and a photocurrent (or sensing current) is produced. Similarly, when the light passes the p-doped region 22p1, the n-doped region 22n1, the p-doped region 22p2, the n-doped region 22n2, the p-doped region 22p3, the n-doped region 22n3 and the p-doped region 22p4 and enters the region defined by the light detecting layer 23, the p-doped region 22p4 and the n-doped region 22n4, incident photons will trigger the generation of free electron-hole pairs in the region defined by the light detecting layer 23, the p-doped region 22p4 and the n-doped region 22n4. Holes move toward the anode node V28, and electrons move toward the cathode node V27, and a photocurrent (or sensing current) is produced.

In some embodiments, a light detecting device may include one n-doped region and one p-doped region located at two opposite ends of a light detecting layer of the light detecting device, and thus the distance between the n-doped region and the p-doped region is limited by the width of the light detecting layer, and the generation rate of the photocurrent is limited by the width of the light detecting layer as well. In accordance with the embodiments as shown in FIGS. 1A, 2A and 3A, since the p-doped regions 22p1, 22p2, 22p3, 22p4 and the n-doped regions, 22n1, 22n2, 22n3, 22n4 are disposed fully or partially across the light detecting layer 23, the distance between two adjacent doped regions would not be limited by the width W21 of the light detecting layer 23. In some embodiments, a distance between a p-doped region and its adjacent n-doped region (e.g., the p-doped region 22p1 and the n-doped region 22n1) is in a range from about few nanometers (nm) to about 500 nm, which is less than the width W21 (e.g., 0.5 μm to 10 μm) of the light detecting layer 23. Hence, the light detecting device 2, 3 or 4 has a higher generation rate of the photocurrent. An AC bandwidth of the photocurrent generated by the light detecting device 2, 3 or 4 is greater than 10 GHz and may achieve about several hundred GHz. In some embodiments, if the distance between two adjacent doped regions (e.g., the p-doped region 22p1 and the n-doped region 22n1) is 100 nm, the AC bandwidth of the photocurrent is about 100 GHz.

In addition, if a length of the n-doped region and the p-doped region is substantially equal to the length of the light detecting layer (e.g., from about 1 μm to about 100 μm), the conductive electrodes connected with the n-doped region and the p-doped region may have a relatively large parasitic capacitance, which would further decrease the AC bandwidth of the light detecting device. In accordance with the embodiments as shown in FIGS. 1A, 2A and 3A, the length of the n-doped regions 22n1, 22n2, 22n3, 22n4 and the p-doped regions 22p1, 22p2, 22p3, 22p4 is substantially equal to the width W21 of the light detecting layer 13 (e.g., from about 0.5 μm to about 10 μm), the parasitic capacitance issue of the conductive electrodes connected with the n-doped regions 22n1, 22n2, 22n3, 22n4 and the p-doped regions 22p1, 22p2, 22p3, 22p4 can be mitigated. In some embodiments, the parasitic capacitance among the conductive electrodes (which are connected with the n-doped regions 22n1, 22n2, 22n3, 22n4 and the p-doped regions 22p1, 22p2, 22p3, 22p4) and ground can be reduced by N, where N is a sum of the n-doped regions and the p-doped regions.

Figure 4A:
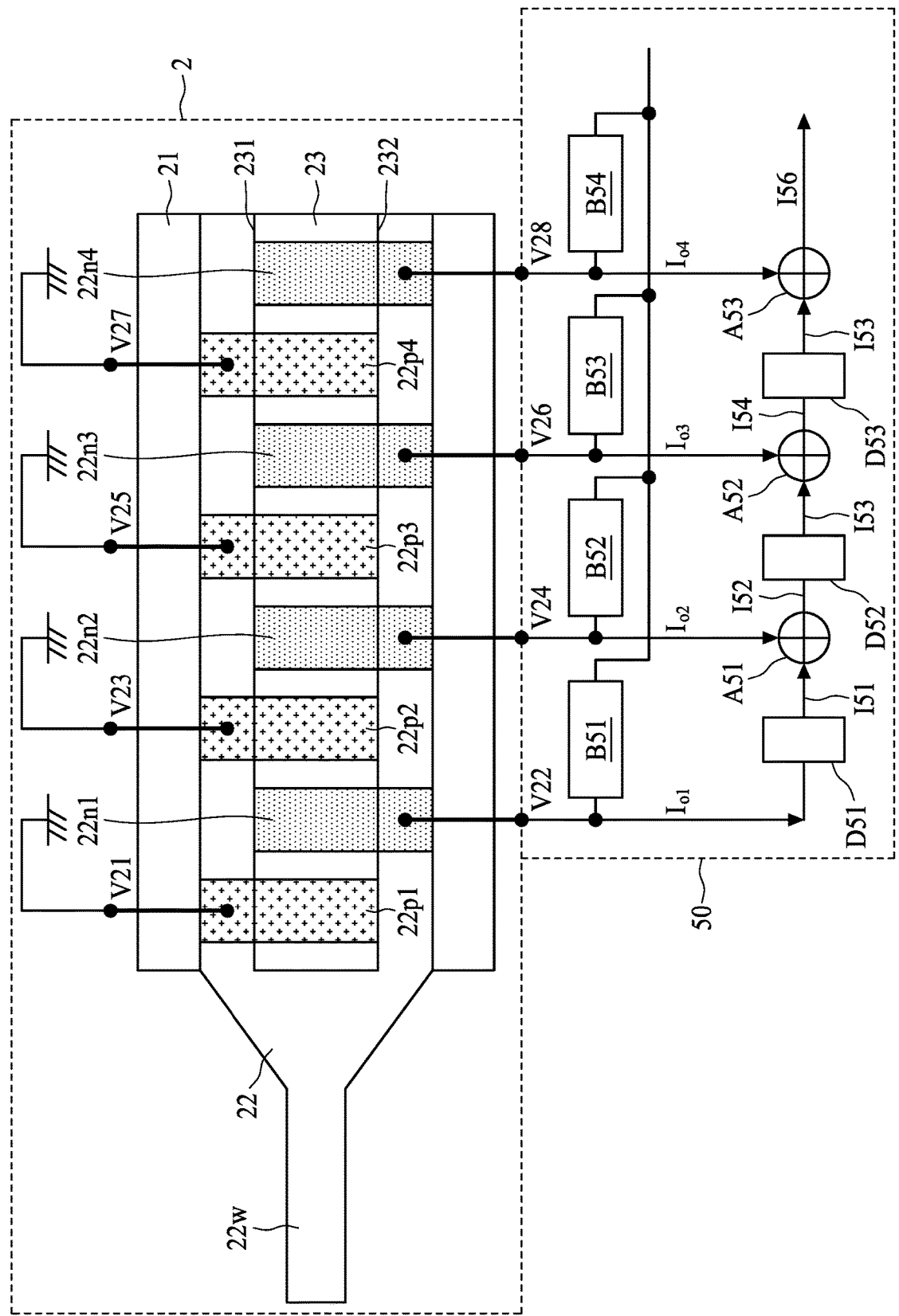
FIG. 4A illustrates a top view of a light detecting device, in accordance with some embodiments of the present disclosure.

FIG. 4A illustrates the light detecting device 2 as shown in FIG. 1A connected with a current generation circuit 50, in accordance with some embodiments of the present disclosure. In some embodiments, the light detecting device 2 may be replaced by the light detecting device 3 as shown in FIG. 2A, the light detecting device 4 as shown in FIG. 3A or any other suitable light detecting devices. In some embodiments, the current generation circuit 50 may be or include an equalizer. The current generation circuit 50 may include one or more DC bias circuits B51, B51, B53, B54, one or more delay circuits D51, D52, D53, and one or more adding circuits (or adder) A51, A52, A53.

In some embodiments, as shown in FIG. 4A, the cathode nodes V21, V23, V25, V27 are connected to ground or to a lower DC voltage (compared with the DC voltage applied to the anode nodes V22, V24, V26, V28), and the anode nodes V22, V24, V26, V28 are connected to a higher DC voltage (compared with the DC voltage applied to the cathode nodes V21. V23, V25, V27). For example, the anode nodes V22, V24, V26, V28 may be connected to the respective DC bias circuits B51, B52, B53 and B54. In other embodiments, all the anode nodes V22, V24, V26, V28 may be connected to a single DC bias circuit. In some embodiments, the anode nodes V22, V24, V26, V28 are provided with the same DC voltage. Alternatively, the anode nodes V22, V24, V26, V28 may be provided with different DC voltages.

In operation, when the light passes the p-doped region 22p1 and enters the region defined by the light detecting layer 23, the p-doped region 22p1 and the n-doped region 22n1, incident photons will trigger the generation of free electron-hole pairs in the region defined by the light detecting layer 23, the p-doped region 22p1 and the n-doped region 22n1. Holes move toward the anode node V22, and electrons move toward the cathode node V21 to generate a photocurrent (or sensing current) $I_{O1}$. When the light passes the p-doped region 22p1, the n-doped region 22n1 and the p-doped region 22p2 and enters the region defined by the light detecting layer 23, the p-doped region 22p2 and the n-doped region 22n2, incident photons will trigger the generation of free electron-hole pairs in the region defined by the light detecting layer 23, the p-doped region 22p2 and the n-doped region 22n2. Holes move toward the anode node V24, and electrons move toward the cathode node V23 to generate a photocurrent (or sensing current) $I_{O2}$. When the light passes the p-doped region 22p1, the n-doped region 22n1, the p-doped region 22p2, the n-doped region 22n2 and the p-doped region 22p3 and enters the region defined by the light detecting layer 23, the p-doped region 22p3 and the n-doped region 22n3, incident photons will trigger the generation of free electron-hole pairs in the region defined by the light detecting layer 23, the p-doped region 22p3 and the n-doped region 22n3. Holes move toward the anode node V26, and electrons move toward the cathode node V25, to generate a photocurrent (or sensing current) $I_{O3}$. When the light passes the p-doped region 22p1, the n-doped region 22n1, the p-doped region 22p2, the n-doped region 22n2, the p-doped region 22p3, the n-doped region 22n3 and the p-doped region 22p4 and enters the region defined by the light detecting layer 23, the p-doped region 22p4 and the n-doped region 22n4, incident photons will trigger the generation of free electron-hole pairs in the region defined by the light detecting layer 23, the p-doped region 22p4 and the n-doped region 22n4. Holes move toward the anode node V28, and electrons move toward the cathode node V27, to generate a photocurrent (or sensing current) $I_{O4}$.

In some embodiments, due to the optical propagation delay along the light detecting layer 23, the photocurrent $I_{O2}$ has a time delay (or a phase difference) with respect to the photocurrent $I_{O1}$, the photocurrent $I_{O3}$ has a time delay (or a phase difference) with respect to the photocurrent $I_{O2}$, and the photocurrent $I_{O4}$ has a time delay (or a phase difference) with respect to the photocurrent $I_{O3}$. For example, compared with the photocurrent $I_{O1}$, the photocurrent $I_{O2}$ may have a phase difference $\varphi_1$, the photocurrent $I_{O3}$ may have a phase difference $2\varphi_1$ and the photocurrent $I_{O4}$ may have a phase difference $3\varphi_1$.

In addition, since the light passes through the p-doped region 22p1, the n-doped region 22n1, the p-doped region 22p2, the n-doped region 22n2, the p-doped region 22p3, the n-doped region 22n3 and the p-doped region 22p4, the intensity of the light would decrease as the light moves away from the waveguide structure 22w. In some embodiments, the loss of the intensity of the light within the light detecting layer 23 is equal to or less than about 5 dB/cm. Hence, the amplitude of the photocurrent $I_{O2}$ is less than the amplitude of the photocurrent $I_{O1}$, the amplitude of the photocurrent $I_{O3}$ is less than the amplitude of the photocurrent $I_{O2}$, and the amplitude of the photocurrent $I_{O4}$ is less than the amplitude of the photocurrent $I_{O3}$.

The photocurrent $I_{O1}$ is sent to the delay circuit D51 to generate a delayed current I51. In some embodiments, the delay time of the delay circuit D51 is substantially equal to the time delay between the photocurrent $I_{O2}$ and the photocurrent $I_{O1}$. Hence the current I51 sent to the adder A51 from the delay circuit D51 does not have a time delay (or has the same phase) with respect to the photocurrent $I_{O2}$. The adding circuit A51 is configured to combine the current I51 and the photocurrent $I_{O2}$ to generate a current I52.

The current I52 is sent to the delay circuit D52 to generate a delayed current I53. In some embodiments, the delay time of the delay circuit D52 is substantially equal to the time delay between the photocurrent $I_{O3}$ and the photocurrent $I_{O2}$. Hence the current I53 sent to the adder A52 from the delay circuit D52 does not have a time delay (or has the same phase) with respect to the photocurrent $I_{O3}$. The adding circuit A52 is configured to combine the current I53 and the photocurrent $I_{O3}$ to generate a current I54.

The current I54 is sent to the delay circuit D53 to generate a delayed current I55. In some embodiments, the delay time of the delay circuit D53 is substantially equal to the time delay between the photocurrent $I_{O4}$ and the photocurrent $I_{O3}$. Hence the current I55 sent to the adder A53 from the delay circuit D53 does not have a time delay (or has the same phase) with respect to the photocurrent $I_{O4}$. The adding circuit A53 is configured to combine the current I54 and the photocurrent $I_{O4}$ to generate an output current I56.

In some embodiments, a light detecting device may merely include a single p-doped region and a single n-doped region, the signal width of the photocurrent generated by the light detecting device is substantially equal to the pulse width of the light inputted to the light detecting device plus the optical propagation delay along the light detecting layer of the light detecting device. Hence, the signal width of the photocurrent generated by the light detecting device is further limited by the optical propagation delay along the light detecting layer, which would restrain the AC bandwidth of the light detecting device. In accordance with the embodiments as shown in FIG. 4A, the light detecting device 2 includes many pairs of n-doped regions and p-doped regions, each pair generating the respective photocurrent, and the photocurrents are sent to the delay circuits D51, D52, D53 and the adding circuit A51, A52, A53 to generate the output current I56. Hence, the optical propagation delay issue can be mitigated. The signal width of the output current I56 generated by the light detecting device 2 is substantially equal to the pulse width of the light inputted to the light detecting device 2 plus the optical propagation delay along the light detecting layer 23 divided by N, where N is a sum of the n-doped regions and the p-doped regions. This would further increase the AC bandwidth of the light detecting device 2.

Figure 4B:
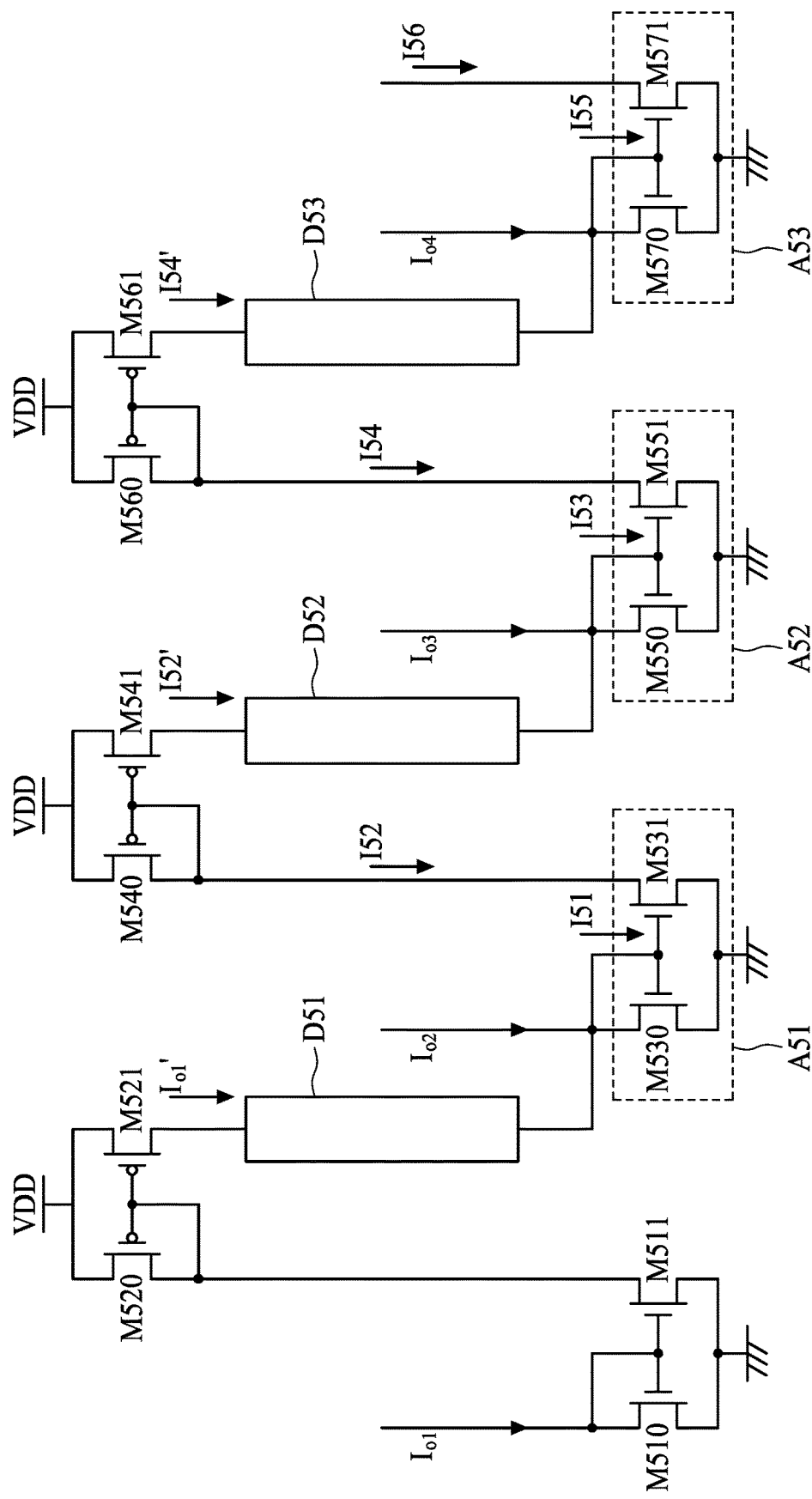
FIG. 4B illustrates a schematic diagram of a current generation circuit, in accordance with some embodiments of the present disclosure.

FIG. 4B illustrates a schematic diagram of a portion of the current generation circuit 50 as shown in FIG. 4A, in accordance with some embodiments of the present disclosure. For the purpose of simplicity and clarity, some of the elements or components are omitted in the drawing. The current generation circuit 50 may include a plurality of transistors M510, M511, M520, M521, M530, M531, M540, M541, M550, M551, M560, M561, M570 and M571 connected or configured to form several current mirror circuits. For example, the PMOS current mirror circuits may be formed by the pairs "the transistors M520 and M521," "the transistors M540 and M541" and "the transistors M560 and M561." For example, the NMOS current mirror circuits may be formed by the pairs "the transistors M510 and M511," "the transistors M530 and M531," "the transistors M550 and M551" and "the transistors M570 and M571." As shown in FIG. 4B, each of the adding circuits A51, A52 and A53 may include one or more current mirror circuits.

In some embodiments, each of the delay circuits D51, D52 and D53 may be achieved by a transmission line. In some embodiments the delay time of each of the delay circuits D51, D52 and D53 can be determined based on the length of the transmission line. For example, the delay time of the transmission line can be expressed by: $\tau = L/Vg$, where $\tau$ represents the delay time of the transmission line, L represents the length of the transmission line and Vg represents the group velocity of the transmission line.

In some embodiments, the transistors of each PMOS current mirror circuit may include the same aspect ratio (W/L) or width. For example, the aspect ratio of the transistor M520, 540 or M560 is respectively the same as that of the transistor M521, M541 or M561. Hence, the amplitude of the current flowing through the transistor M520, M540 or M560 would be substantially the same as the amplitude of the current flowing through the transistor M521, M541 or M561, respectively. For example, the amplitude of the current $I_{O1}'$ is substantially the same as the amplitude of the photocurrent $I_{O1}$, the amplitude of the current I52' is substantially the same as the amplitude of the current I52, and the amplitude of the current I54' is substantially the same as the amplitude of the current I54. Hence, the amplitude of output current I56 is substantially equal to a sum of the amplitudes of the photocurrents $I_{O1}, I_{O2}, I_{O3}$ and $I_{O4}$.

In some embodiments, the transistors of each PMOS current mirror circuit may include different aspect ratios or widths. For example, the aspect ratio of the transistor M520, 540 or M560 is respectively different from that of the transistor M521, M541 or M561. Hence, the amplitude of the current flowing through the transistor M520, M540 or M560 would be different from the amplitude of the current flowing through the transistor M521, M541 or M561, respectively. For example, the amplitude of the current $I_{O1}'$ is different from the amplitude of the photocurrent $I_{O1}$, the amplitude of the current I52' is different from the amplitude of the current I52, and the amplitude of the current I54' is different from the amplitude of the current I54. Hence, the amplitude of output current I56 is substantially equal to a ratio times a sum of the amplitudes of the photocurrents $I_{O1}, I_{O2}, I_{O3}$ and $I_{O4}$, where the ratio is corresponding to the aspect ratios of the transistors of each PMOS current mirror circuit. By choosing the transistor M521, M541 or M561 having a relatively larger aspect ratio or width than the transistor M521, M541 or M561 respectively, the amplitude of the output current I56 can be increased. This would increase the flexibility for circuit design.

FIGS. 5A through 5D are cross-sectional views of intermediate structures of a method of manufacturing a light detecting device, in accordance with some embodiments. In some embodiments, the operations illustrated in FIGS. 5A through 5D can be used to form the light detecting device 2 as shown in FIGS. 1A, 1B, 1C and 1D. Alternatively, the operations illustrated in FIGS. 5A through 5D can be used to form any other light detecting devices.

Figure 5A:
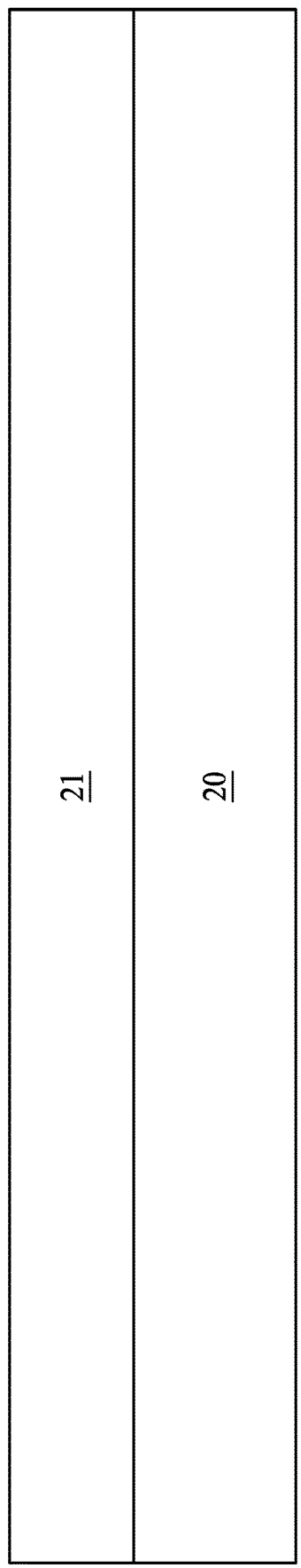
FIGS. 5A-5D are a series of cross-sectional views illustrating processing steps to fabricate a light detecting device, in accordance with some embodiments of the present disclosure.

Referring to FIG. 5A, a substrate 20 is provided or received. The substrate 20 includes a semiconductor material such as silicon. In some embodiments, the substrate 20 may include other semiconductor materials, such as silicon germanium, silicon carbide, gallium arsenide, or the like. Alternatively, the substrate 20 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the substrate 20 is a SOI. In other alternatives, the substrate 20 may include a doped epitaxial layer, a gradient semiconductor layer, and/or a semiconductor layer overlaying another semiconductor layer of a different type, such as a silicon layer on a silicon germanium layer. The substrate 20 may be doped with an n-type dopant, such as arsenic, phosphor, or the like, or may be doped with a p-type dopant, such as boron or the like.

An insulating layer 21 is then formed on the substrate 20. The insulating layer 21 may be STI or local oxidation of silicon LOCOS. The insulating layer 21 may be formed of electrically insulating materials, such as dielectric materials. In some embodiments, the insulating layer 21 are formed of an oxide (e.g., silicon oxide or Ge oxide), a nitride (e.g., silicon nitride), an oxynitride (e.g., GaP oxynitride), $SiO_2$, a nitrogen-bearing oxide (e.g., nitrogen-hearing $SiO_2$), a nitrogen-doped oxide (e.g., N2-implanted $SiO_2$), silicon oxynitride ($Si_xO_yN_z$), a polymer material, or the like. The dielectric material may be formed using a suitable process such as atomic layer deposition (ALD), chemical vapor deposition (CVD), physical vapor deposition (PVD), thermal oxidation, UV-ozone oxidation, or combinations thereof. In some embodiments, a planarization operation, such as grinding or chemical mechanical planarization (CMP) processes, may be used to remove excess materials of the insulating layer 21.

Figure 5B:
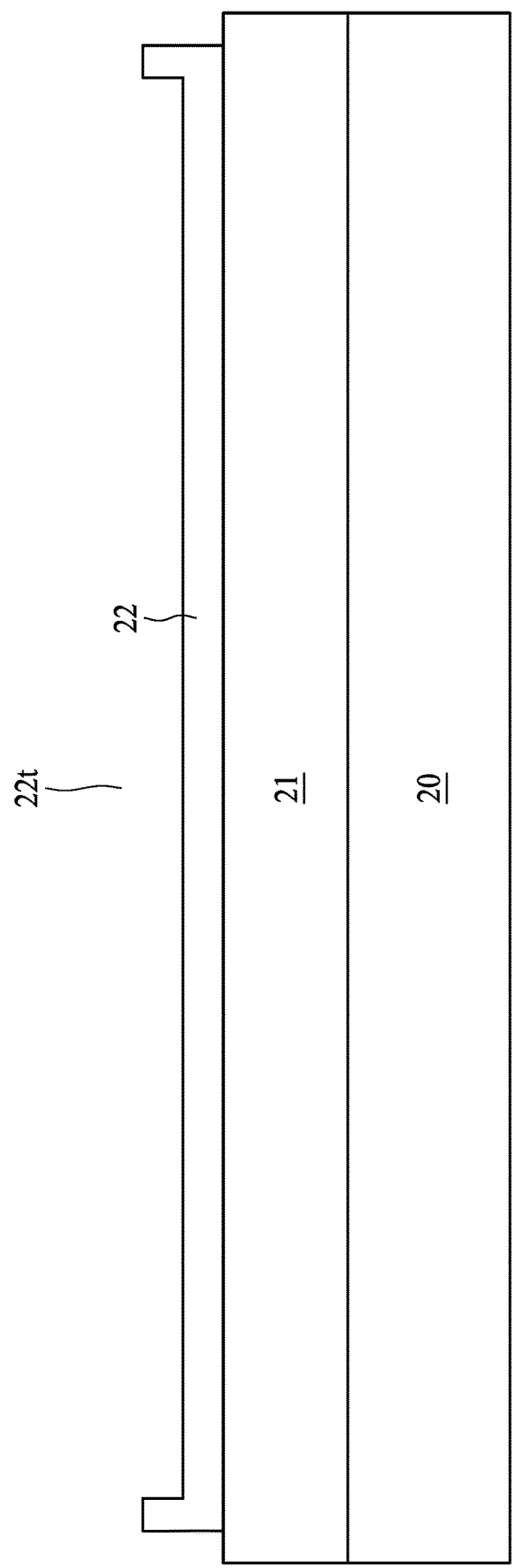
Figure 5C:
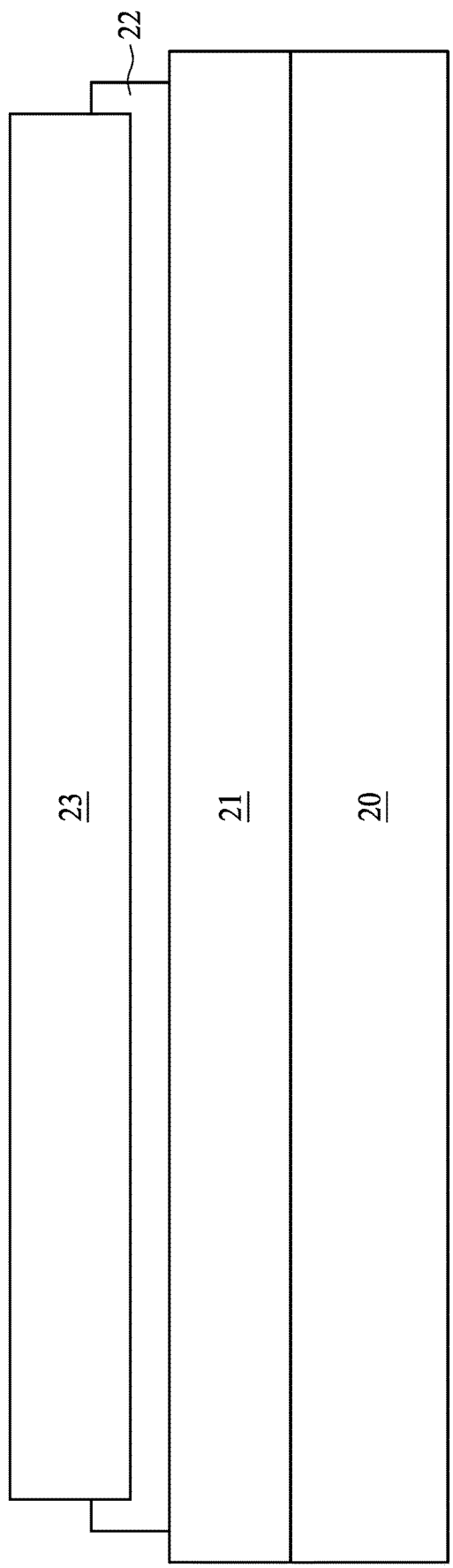

Referring to FIG. 5B, a silicon layer 22 is formed or disposed on the insulating layer 21. A trench 22t is formed from a top surface of the silicon layer 22 into the silicon layer 22. In some embodiments, a portion of the silicon layer 22 remains to define a bottom surface of the trench 22t. In some embodiments, the silicon layer 22 may be formed by, for example, an etching (e.g., dry etching, a wet etching, a reactive ion etching (RIE) operation, or the like) or any other suitable operations. Then, as shown in FIG. 5C, the trench 21t is filled with a light detecting layer 23. The light detecting layer 23 may protrude from the top surface of the silicon layer 22.

Figure 5D:
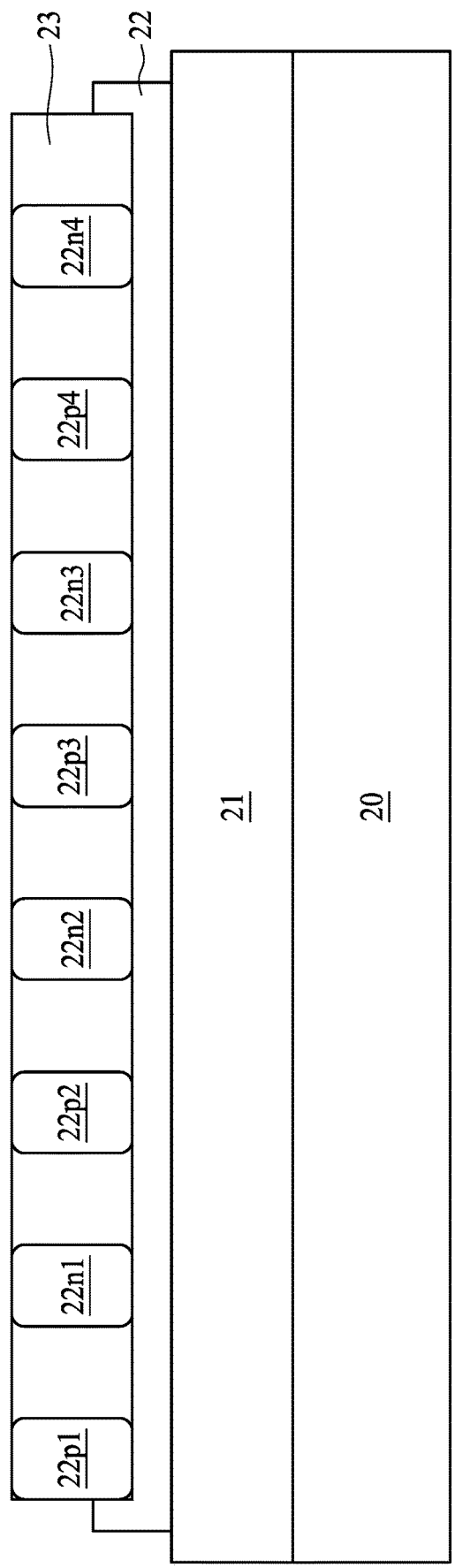

Referring to FIG. 5D, p-doped regions 22p1, 22p2, 22p3, 22p4 and n-doped regions 22n1, 22n2, 22n3, 22n4 are formed in the silicon layer 22 and the light detecting layer 23. As shown in FIG. 5D, the n-doped regions 22n1, 22n2, 22n3, 22n4 and the p-doped regions 22p1, 22p2, 22p3, 22p4 are alternatingly arranged. In other words, there is one n-doped region between two adjacent p-doped regions or there is one p-doped region between two adjacent n-doped regions. In some embodiments, there may be any number of n-doped regions and p-doped regions depending on different design specifications. For example, there may be N n-doped regions and N p-doped regions, where N is an integer greater than 1.

In some embodiments, the p-doped regions 22p1, 22p2, 22p3, 22p4 and the n-doped regions 22n1, 22n2, 22n3, 22n4 may be formed by implanting dopants by an ion implantation operation, an epitaxy operation or any other suitable operations. Ions or dopants are implanted to desired portions of the silicon layer 22 and the light detecting layer 23. In some embodiments, a photomask may be used to permit only the desired portions to receive dopants. The doping concentration amounts for the n-doped regions 22n1, 22n1, 22n3, 22n4 and the p-doped regions 22p1, 22p2, 22p3, 22p4 may vary with the process used and the particular design. In some embodiments, doping concentrations at a p-type material or an n-type material may range from about $10^{17}$ atoms/cm$^3$ to $10^{19}$ atoms/cm$^3$.

In some embodiments, a waveguide structure may be formed or defined when the silicon layer 22 is formed. The waveguide structure may extend in a first direction (e.g., axial direction) substantially parallel to the length of the light detecting layer. The waveguide structure may serve as a conduit for guiding light (or photons) into the light detecting layer 23 in the first direction. The p-doped regions 22p1, 22p2, 22p3, 22p4 and the n-doped regions 22n1, 22n2, 22n3, 22n4 are alternatingly arranged in a direction substantially perpendicular to the first direction.

In some embodiments, the present disclosure provides a light detecting device. The light detecting devices includes an insulating layer, a silicon layer, a light detecting layer, N first doped regions and M second doped regions. The silicon layer is disposed over the insulating layer. The light detecting layer is disposed over the silicon layer and extends within at least a portion of the silicon layer. The first doped regions have a first dopant type and are disposed within the light detecting layer. The second doped regions have a second dopant type and are disposed within the light detecting layer. The first doped regions and the second doped regions are alternatingly arranged. M and N are integers equal to or greater than 2.

In some embodiments, the present disclosure provides a light detecting device. The light detecting device includes an insulating layer, a silicon layer, a light detecting layer, a waveguide structure, a first doped region and a second doped region. The silicon layer is disposed over the insulating layer. The light detecting layer is disposed over the silicon layer and extends within at least a portion of the silicon layer. The waveguide structure is disposed adjacent to the silicon layer and extends in a first direction. The first doped region has a first dopant type and is disposed within the light detecting layer. The second doped region has a second dopant type and is disposed within the light detecting layer. The first doped region and the second doped region are arranged in a second direction substantially perpendicular to the first direction.

In some embodiments, the present disclosure provides an optical device. The optical device includes an insulating layer, a silicon layer and a light detecting layer. The silicon layer is disposed over the insulating layer. The light detecting layer is disposed over the silicon layer and extends within at least a portion of the silicon layer. The light detecting layer has a first region and a second region spaced apart from the first region. The first region of the light detecting layer is configured to convert a light to a first photocurrent. The second region is configured to convert the light received from the first region to a second photocurrent. An amplitude of the second photocurrent is less than an amplitude of the first photocurrent.

In some embodiments, the present disclosure provides a method of manufacturing a light detecting device. The method includes (a) providing a substrate; (b) forming an insulating layer on the substrate; (c) forming a silicon layer on the insulating layer; (d) forming a light detecting layer on the silicon layer and extending within at least a portion of the silicon layer; (e) forming two or more first doped regions of a first dopant type within the light detecting layer; and (f) forming two or more second doped regions of a second dopant type within the light detecting layer. The first doped regions and the second doped regions are alternatingly arranged.

The scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such as processes, machines, manufacture, compositions of matter, means, methods or steps/operations. In addition, each claim constitutes a separate embodiment, and the combination of various claims and embodiments are within the scope of the disclosure.

What is claimed is:

1. A method of manufacturing a light detecting device, comprising:
    (a) providing a substrate;
    (b) forming an insulating layer on the substrate;
    (c) forming a silicon layer on the insulating layer;
    (d) forming a light detecting layer on the silicon layer and extending within at least a portion of the silicon layer;
    (e) forming two or more first doped regions of a first dopant type within the light detecting layer; and
    (f) forming two or more second doped regions of a second dopant type within the light detecting layer,
    wherein the first doped regions and the second doped regions are alternatingly arranged in a first direction, and
    wherein at least one of the first doped regions comprises a first part within the light detecting layer and a second part extending beyond a first lateral surface of the light detecting layer in a second direction substantially perpendicular to the first direction, the first part overlaps the second doped regions as viewed in the first direction, and the second part is free from overlapping the second doped regions as viewed in the first direction.

2. The method of claim 1, wherein operation (d) further comprises:
    forming a trench from a top surface of the silicon layer into the silicon layer; and
    filling the trench with the light detecting layer.

3. The method of claim 1, further comprising forming a waveguide structure adjacent to the silicon layer and extending in the second direction.

4. The method of claim 1, wherein the first doped regions are further formed within a portion of the silicon layer adjacent to the first lateral surface of the light detecting layer and diffusing from the first lateral surface of the light detecting layer to a second lateral surface of the light detecting layer opposite to the first lateral surface of the light detecting layer.

5. The method of claim 4, wherein the second lateral surface of the light detecting layer substantially aligns with lateral surfaces of the first doped regions, and the first lateral surface of the light detecting layer substantially aligns with lateral surfaces of the second doped regions.

6. The method of claim 4, wherein one of the first doped regions comprises a first portion disposed within the portion of the silicon layer adjacent to the first lateral surface of the light detecting layer and a second portion within the light detecting layer, and a thickness of the second portion of the one of the first doped regions is greater than a thickness of the first portion of the one of the first doped regions and less than a thickness of the light detecting layer.

7. A method of manufacturing a light detecting device, comprising:
   (a) receiving an insulating layer;
   (b) forming a silicon layer on the insulating layer;
   (c) forming a light detecting layer on the silicon layer and extending within at least a portion of the silicon layer;
   (d) forming two or more first doped regions of a first dopant type within the light detecting layer; and
   (e) forming two or more second doped regions of a second dopant type within the light detecting layer,
   wherein one of the first doped regions comprises a first portion within a first part of the silicon layer adjacent to a first lateral surface of the light detecting layer and a second portion within the light detecting layer, and a bottom surface of the first portion contacts a portion of the silicon layer and is substantially aligned with a bottom surface of the second portion.

8. The method of claim 7, wherein the first doped regions and the second doped regions are alternatingly arranged.

9. The method of claim 7, wherein a width of the second portion of the one of the first doped regions is substantially the same as a width of the light detecting layer.

10. The method of claim 7, further comprising forming a waveguide structure extending in a first direction and configured to direct a light to the light detecting layer.

11. The method of claim 7, wherein the first doped regions and the second doped regions further extend within the silicon layer.

12. The method of claim 7, wherein operation (c) further comprises:
   forming a trench from a top surface of the silicon layer into the silicon layer, wherein a portion of the silicon layer remains to define a bottom surface of the trench; and
   disposing the light detecting layer on the bottom surface in the trench.

13. The method of claim 7, wherein one of the second doped regions comprises a third portion within a second part of the silicon layer adjacent to a second lateral surface of the light detecting layer and a fourth portion within the light detecting layer.

14. The method of claim 13, wherein the first portion of the one of the first doped regions and the third portion of the one of the second doped regions are at opposite sides of the light detecting layer from a top view perspective, and the second portion of the one of the first doped regions and the fourth portion of the one of the second doped regions are disposed across the light detecting layer and separated by a distance less than a width of the light detecting layer.

15. A method of manufacturing a light detecting device, comprising:
   (a) receiving an insulating layer;
   (b) forming a silicon layer on the insulating layer;
   (c) forming a light detecting layer on the silicon layer and extending within at least a portion of the silicon layer;
   (d) forming a first doped region of a first dopant type across the light detecting layer; and
   (e) forming a second doped region of a second dopant type across the light detecting layer,
   wherein the first doped region and the second doped region further extend within the silicon layer and are spaced apart from the insulating layer by a portion of the silicon layer.

16. The method of claim 15, further comprising a plurality of the first doped regions and a plurality of the second regions, and the first doped regions and the second doped regions are alternatingly arranged.

17. The method of claim 15, wherein the first doped region and the second doped region further extend within the light detecting layer.

18. The method of claim 15, further comprising:
   forming a third doped region of the first dopant type across the light detecting layer; and
   forming a fourth doped region of the second dopant type across the light detecting layer, wherein the first doped region, the second doped region, the third doped region, and the fourth doped region are arranged sequentially along a first direction.

19. The method of claim 18, further comprising forming a waveguide structure connected to the silicon layer and extending in the first direction to be configured to direct a light to the light detecting layer.

20. The method of claim 19, wherein the first doped region comprises a first portion within a portion of the silicon layer extending away from a lateral surface of the light detecting layer and a second portion within the light detecting layer.

* * * * *